(12) United States Patent
Alpert et al.

(10) Patent No.: US 9,038,009 B2
(45) Date of Patent: May 19, 2015

(54) EARLY DESIGN CYCLE OPTIMIZATION

(71) Applicant: International Business Machines Corporation, Armonk, NY (US)

(72) Inventors: Charles Jay Alpert, Austin, TX (US); Robert M. Averill, III, Poughkeepsie, NY (US); Zhuo Li, Cedar Park, TX (US); Jose L. P. Neves, Poughkeepsie, NY (US); Stephen T. Quay, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/100,553

(22) Filed: Dec. 9, 2013

(65) Prior Publication Data

US 2014/0101629 A1 Apr. 10, 2014

Related U.S. Application Data

(63) Continuation of application No. 13/486,177, filed on Jun. 1, 2012, now Pat. No. 8,640,075.

(51) Int. Cl.
*G06F 17/50* (2006.01)

(52) U.S. Cl.
CPC .................... *G06F 17/505* (2013.01)

(58) Field of Classification Search
CPC .................. H04N 19/00478; H04N 19/00484; H04N 19/00781; H04N 19/00533; H04N 19/00775; G06F 21/554; G06F 21/57; G06F 21/575; G06F 21/64; G06F 21/71; G06F 21/73; G06F 21/74; G06F 21/75; G06F 21/78; G06F 17/5031; G11C 11/4074; G11C 11/4076; G11C 29/46; G11C 5/147

USPC .................................................. 716/106–110
See application file for complete search history.

(56) References Cited

U.S. PATENT DOCUMENTS

| 5,764,525 | A | 6/1998 | Mahmood et al. |
| 6,701,505 | B1 | 3/2004 | Srinivasan |
| 7,444,600 | B2 * | 10/2008 | Kameyama et al. .......... 716/115 |
| 7,555,740 | B2 * | 6/2009 | Buck et al. .................... 716/134 |

(Continued)

OTHER PUBLICATIONS

"U.S. Appl. No. 13/486,177 Office Action", Sep. 14, 2012, 19 pages.

(Continued)

*Primary Examiner* — Binh Tat
(74) *Attorney, Agent, or Firm* — DeLizio Gilliam, PLLC

(57) ABSTRACT

Some example embodiments include a computer-implemented method for designing an integrated circuit. The computer-implemented method includes receiving a hierarchical network design for the integrated circuit, wherein the hierarchical design comprises a number of components that are coupled together. The computer-implemented method includes detecting that a component of the number of components has at least one of failed timing and incomplete timing based on a problem that comprises at least one of a missing assertion, one or more missing latches, a source driver having an input source slew that is greater than a source slew limit threshold, and a sink having an input sink slew that is greater than a sink slew limit threshold. The computer-implemented method includes replacing the component with a different component that is independent of the problem and testing others components of the number of components based on the different component.

9 Claims, 7 Drawing Sheets

(56) References Cited

U.S. PATENT DOCUMENTS

| | | |
|---|---|---|
| 7,716,616 B2 | 5/2010 | Foreman et al. |
| 7,810,062 B2 | 10/2010 | Curtin et al. |
| 7,886,246 B2 | 2/2011 | Buck et al. |
| 8,103,997 B2 | 1/2012 | Sinha et al. |
| 8,151,228 B2 | 4/2012 | Ramachandran et al. |
| 8,239,798 B1 | 8/2012 | Goyal et al. |
| 8,640,075 B2 * | 1/2014 | Alpert et al. .............. 716/134 |
| 2006/0253814 A1 | 11/2006 | Porter et al. |
| 2008/0209373 A1 * | 8/2008 | Buck et al. .............. 716/6 |
| 2010/0269083 A1 * | 10/2010 | Sinha et al. .............. 716/11 |
| 2013/0326450 A1 | 12/2013 | Alpert et al. |

OTHER PUBLICATIONS

Burstein, Michael et al. "Timing-Influenced Layout Design", Original Disclosure Information: TDB 04-86 p. 4981-4987, IP.com No. IPCOM000060522D Apr. 1, 1986, 7 pages.

Changfan, Chieh et al., "Timing Optimization on Routed Designs with Incremental Placement and Routing Characterization", Computer-Aided Design of Integrated Circuits and Systems, IEEE Transactions on vol. 19, Issue: 2 Feb. 2000, pp. 188-196.

IBM, , "A System for Early Design Planning and Analysis", IP.com No. IPCOM000181821D Apr. 14, 2009, 3 pages.

* cited by examiner

EARLY DESIGN CYCLE OPTIMIZATION

RELATED APPLICATIONS

This application is a Continuation of and claims the priority benefit of U.S. application Ser. No. 13/486,177 filed Jun. 1, 2012.

BACKGROUND

Embodiments of the inventive subject matter generally relate to the field of computers, and, more particularly, to early design cycle optimization for different designs (e.g., electronic circuits).

Organizing circuits on a substrate of a semiconductor is a task that can achieve efficiencies in overall circuit speed when electronic design automation instructions are processed on a data processing system to reduce delays in circuit operation. A source of delay within a Very Large Scale Integrated (VLSI) circuit design is the time delay associated with signals traveling from one component to another.

Traditionally, for some circuit designs, there are a number of designers designing different components at the same time. In the early design cycle, at the unit or top level for hierarchical designs, buffers can be dominant; netlists may have missed assertions; Random Logic Macros (RLMs) have not yet been optimized; and latches can be missed. Optimization of such circuit designs may not recognize these problems, thereby over promoting the design with massive layer assignments and causing big congestion therein or over-inserting buffers that cause big area and power blowup of the designs. Accordingly, the designers do not have a clear view of the congestion and timing in the early design cycles. Traditionally, the designers assume that such incomplete timing information could be resolved later in the design process or macro designers could correct the macro buffer locations at a later time. However, completely ignoring the components with problems may underestimate the resources needed for the design closure.

SUMMARY

Some example embodiments include a computer-implemented method for designing an integrated circuit. The computer-implemented method includes receiving a hierarchical network design for the integrated circuit, wherein the hierarchical design comprises a number of components that are coupled together. The computer-implemented method includes detecting that a component of the number of components has at least one of failed timing and incomplete timing based on a problem that comprises at least one of a missing assertion, one or more missing latches, a source driver having an input source slew that is greater than a source slew limit threshold, and a sink having an input sink slew that is greater than a sink slew limit threshold. The computer-implemented method includes replacing the component with a different component that is independent of the problem and testing others components of the number of components based on the different component.

Some example embodiments include a computer-implemented method for designing an integrated circuit. The computer-implemented method includes receiving a hierarchical network design for the integrated circuit, wherein the hierarchical design comprises a number of components that are coupled together. The computer-implemented method includes detecting that a first component of the number of components has at least one of failed timing and incomplete timing based on a problem that comprises at least one of a missing assertion and one or more missing latches, wherein the first component comprises a wiring that connects a second component and a third component of the number of components. The computer-implemented method includes replacing the first component with a different component that is independent of the problem and testing others components of the number of components based on the different component.

BRIEF DESCRIPTION OF THE DRAWINGS

The present embodiments may be better understood, and numerous objects, features, and advantages made apparent to those skilled in the art by referencing the accompanying drawings.

DESCRIPTION OF EMBODIMENT(S)

Figure 1:
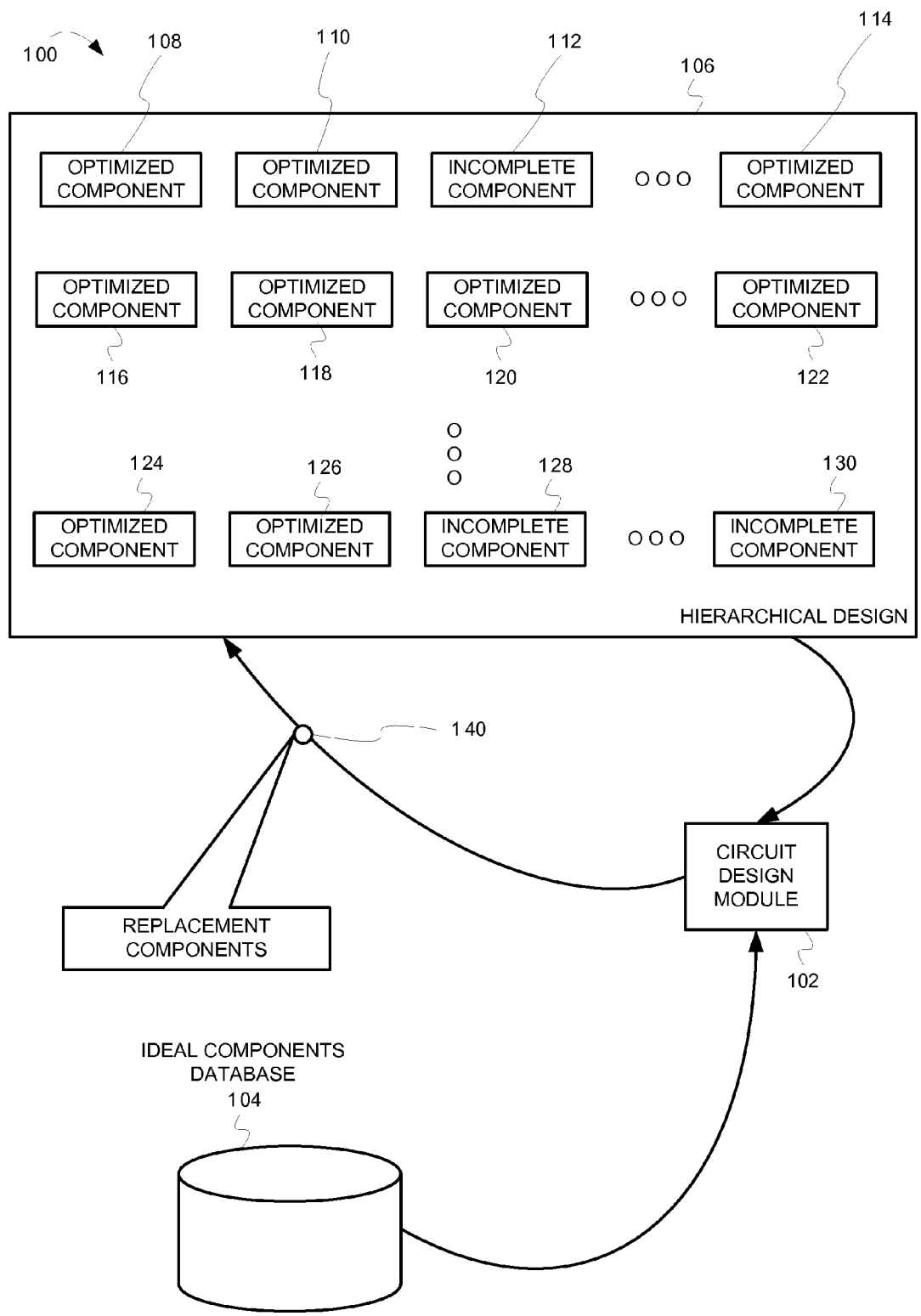
FIG. 1 depicts a system for early design cycle optimization for designs having components with incomplete or failed timing, according to some example embodiments.

The description that follows includes exemplary systems, methods, techniques, instruction sequences and computer program products that embody techniques of the present inventive subject matter. However, it is understood that the described embodiments may be practiced without these specific details. For instance, although examples refer to hierarchical network-based integrated circuit, some embodiments can use any type of integrated circuit. In other instances, well-known instruction instances, protocols, structures and techniques have not been shown in detail in order not to obfuscate the description.

In some example embodiments, an integrated circuit is comprised of multiple components that are being designed. Some example embodiments are applicable to a hierarchical network design having multiple layers wherein some components in the design are not yet complete. Examples of components in a design can include source components, sink components, wires connecting other components, etc. Some example embodiments identify components that have failed or incomplete data ("incomplete components"). These incomplete components can have non-optimized data, such as long non-optimized paths inside the components, missing logic for interconnect wires or wrong assertions (input). These incomplete components can be identified by measuring the behavior of the components and comparing these measurements to measurements of ideal components. For example, the behavior of the component to be measured can include timing of the signals being transmitted and processed.

These incomplete components can be replaced with the ideal components, thereby enabling the remaining part of the network to be optimized. Additionally, the constraints defined by the replacement component can be provided back to the designer of the incomplete component that was replaced. Such a design with replacement components precludes these incomplete components from creating congestion in the design with over buffering and overuse of the higher metal layers, thereby enabling other components that are complete to be properly tested at an integration level. Accordingly, for a hierarchical network design, designers may simultaneously design at different levels even though other components in the design are not yet complete.

Some example embodiments identify components that have one or more of the following problems: 1) missing or failed assertions, 2) one or more missing latches, 3) a weak source, and 4) a flabby sink. Also, a given component can have none, some or all of these problems. These components are considered different types of incomplete components for the design. Also, the incomplete components are replaced with replacement components to minimize congestion in the designs caused by over buffering and to minimize use of the higher metal layers in the design. Such embodiments enable the different designers of the different components to still receive a good view of congestion and timing tradeoff. Also, the different designers can determine if there are other paths in the design that may have the problem. The different designers can determine if the floorplan of the design needs to be changed or if pin assignments need to be adjusted.

The incomplete components in the design can be identified and replaced using different approaches. For identifying the problem of missing or failed assertions or one or more missing latches, the components at the top level in the hierarchical design can be idealized such that there is zero wire load modeling. Alternatively for this problem, "ideal buffering" modeling can be used that assumes buffers can be inserted at the highest metal layer with the best resistance and capacitance parasitic and best Steiner topology (such as Steiner Tree that ignores blockage or a best blockage aware Steiner Tree). The components that do not meet a defined slack threshold for timing are identified. For these components, the assertions can be changed to make the slack positive and/or mark the next to be "not for layer promotion" but still allowing buffering to fix the slew violations. However in some example embodiments for these components, promotion to higher layers in the design is not allowed.

For identifying the problem of weak sources, in some example embodiments, the components at the top level of the design are disconnected. By adding a buffer at the boundary, the components having an input source slew at this buffer that is greater than a defined source slew limit threshold are then identified as components with weak sources (as further described below). These components are modified such that a buffer is positioned at its output boundary. An ideal input source slew is asserted at the input side of the buffer, and the output slew of the buffer will be less than the source slew limit threshold. Additionally, this buffering can be performed at the top level of the hierarchical design.

For identifying the problem of flabby sinks, in some example embodiments, the components at the top level of the design are disconnected. The components having an input sink slew that is greater than a defined sink slew limit threshold are then identified as components with flabby sinks (as further described below). These components are modified such that a buffer is positioned at its input boundary such that input sink slew is less than the sink slew limit threshold. Additionally, this buffering can be performed at the top level of the hierarchical design.

Some example embodiments are not limited to integrated circuits. Some example embodiments are applicable to other designs having multiple components that are designed by different designers at a same time. Some example embodiments are applicable to an energy network design. For example, an incomplete component in such a design can include a transformer. Some example embodiments are also applicable designs that include alternative energy sources (e.g., power plant, wind, solar, etc.). Some of these alternative energy sources may not be constantly available or have emergency failures. For example, local power connection wires can be broken. A stable network is needed to not only repair failed components, but to also not cause a large disruption or changes to the network. In such a configuration, the components in the network can be monitored. An alarm is issued when a component's attributes do not match the expected values in a database for the components. The backup network can be enabled for the failed network. Also, these components that have failed can be modeled with modules such that it appears that the network is running correctly to those external to the network.

FIG. 1 depicts a system for early design cycle optimization for designs having components with incomplete or failed timing, according to some example embodiments. A system 100 includes a circuit design module 102 and a database 104 for storage of ideal components for a design. For example, the design for a communication logic component for communicating with a microprocessor and an L1 cache as part of a microprocessor design. The design can include a layout, timing, etc. The database 104 can also define the slew limit thresholds, slack thresholds, etc. for the ideal components, as further described below. A hierarchical design 106 includes a number of components therein. The components can be at different levels of the design and although not shown can be communicatively couple together.

The hierarchical design 106 can be represented as code or language that can be processed by the circuit design module 102. In this example, the hierarchical design 106 includes components that have been optimized or components that are incomplete. The optimized components include optimized components 108, 110, 114, 116, 118, 120, 122, 124, and 126. The incomplete components include incomplete components 112, 128, and 130. The circuit design module 102 is configured to receive and process the hierarchical design 106 (as described in more detail below). In particular, the circuit design module 102 can process the different component of the hierarchical design 106 to identify the incomplete components and to replace the incomplete components with replacement components 140. In some example embodiments, the identification of the incomplete components and their replacement is based on components stored in the ideal components database 104. The components can be tested to determine which components have incomplete or failed timing. Examples of testing and replacement of components based on different problems is described below in reference to FIGS. 2-5.

Figure 2:
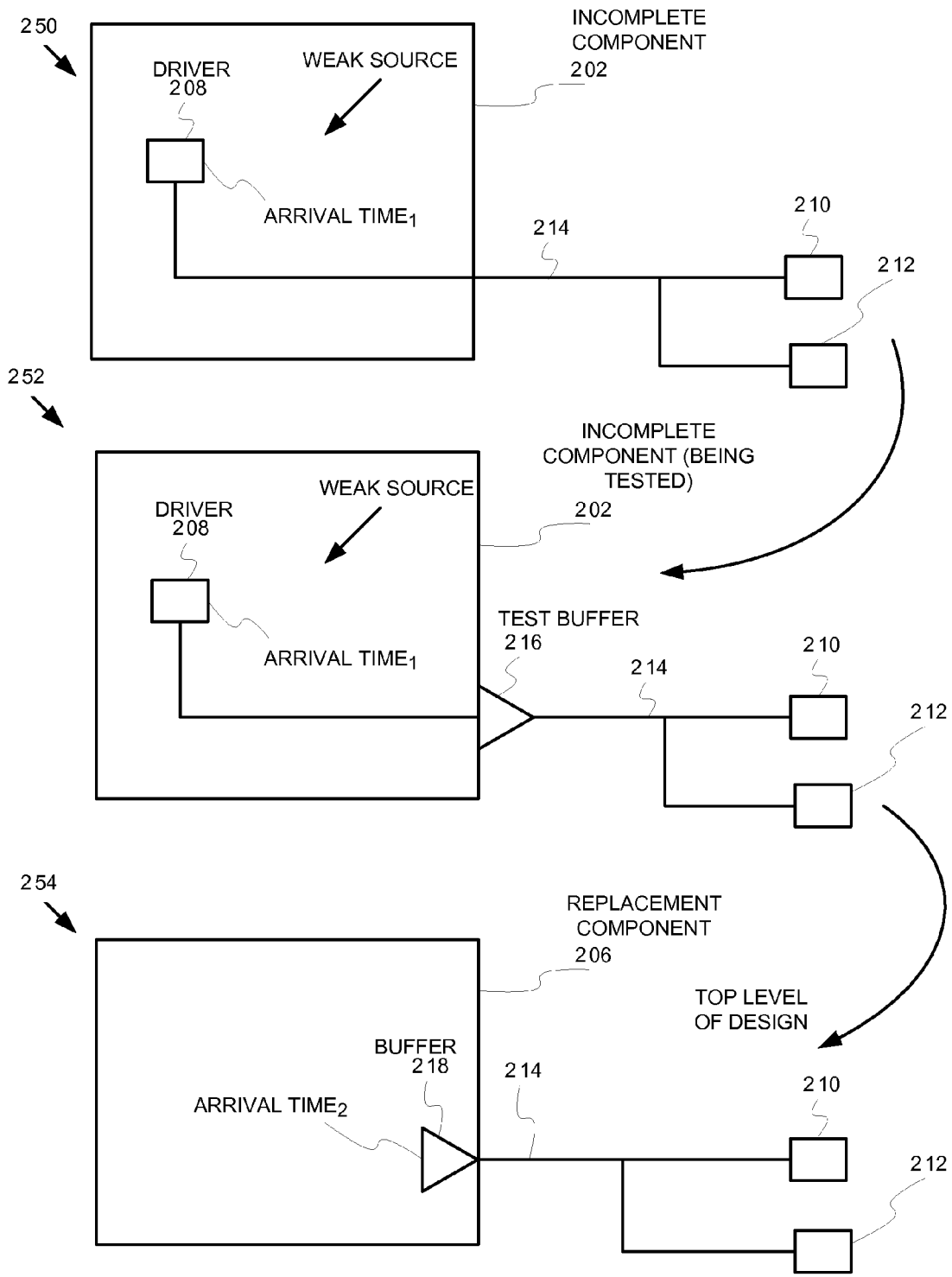
FIG. 2 depicts replacement of an incomplete component having a weak source, according to some example embodiments.

FIG. 2 depicts replacement of an incomplete component having a weak source, according to some example embodiments. FIG. 2 depicts three stages for a component having a weak source in the design. A first stage 250 is prior to the component being tested. A second stage 252 is during at time when the component is being tested to determine if the component has a weak source. A third stage 254 is after testing and includes a replacement of the incomplete component.

At the first stage 250, an incomplete component 202 includes a driver 208 that is coupled to two receivers 210 and 212 (external to the incomplete component) through a wire 214. The driver 208 drives a signal to the two receivers 210 and 212. Also, the time of a signal arriving at the driver 208 is defined as Arrival Time$_1$ (AT$_1$).

The circuit design module 102 of FIG. 1 tests the components in the hierarchical design that includes a source therein. For this example, the circuit design module 102 would position a test buffer 216 at a boundary of the incomplete component 202 between the driver 208 and the receivers 210 and 212 (as shown at the second stage 252). The circuit design module 102 then measures the input slew at the test buffer 216. If the input slew is greater than a source slew limit threshold, then the component is considered to be incomplete because of a weak source. The source slew limit threshold can be a value that varies depending on the particular design, the type of technology, the specifications for the design, etc.

In response (shown at third stage 254), the circuit design module 102 would replace the incomplete component in the hierarchical design with a replacement component (shown as a replacement component 206). In this replacement component, the internal network of the incomplete component is removed and replaced by a buffer 218 at the boundary of the replacement component 206 for transmitting a signal to the receivers 210 and 212. Also, the buffer 218 is moved to the top level of the hierarchical design. The time of the signal arriving at the buffer is defined as Arrival Time$_2$ (AT$_2$), which is defined as follows:

$$AT_2 = AT_1 + L * \text{time of flight (internal layer)}$$

Wherein L is defined as the length of the wire connecting the driver 208 to the boundary where the test buffer 216 is located. The unit for the time of flight can be based on picoseconds/millimeter. Accordingly, the unit for AT$_2$ can be picoseconds. The AT$_2$ calculation assumes an ideal buffering and layer assignment in the macro for the component. Additionally, a new input slew is defined for the replacement component 206. The new input slew is assigned to be less than the source slew limit threshold and can vary based on the technology of the design and the component.

Figure 3:
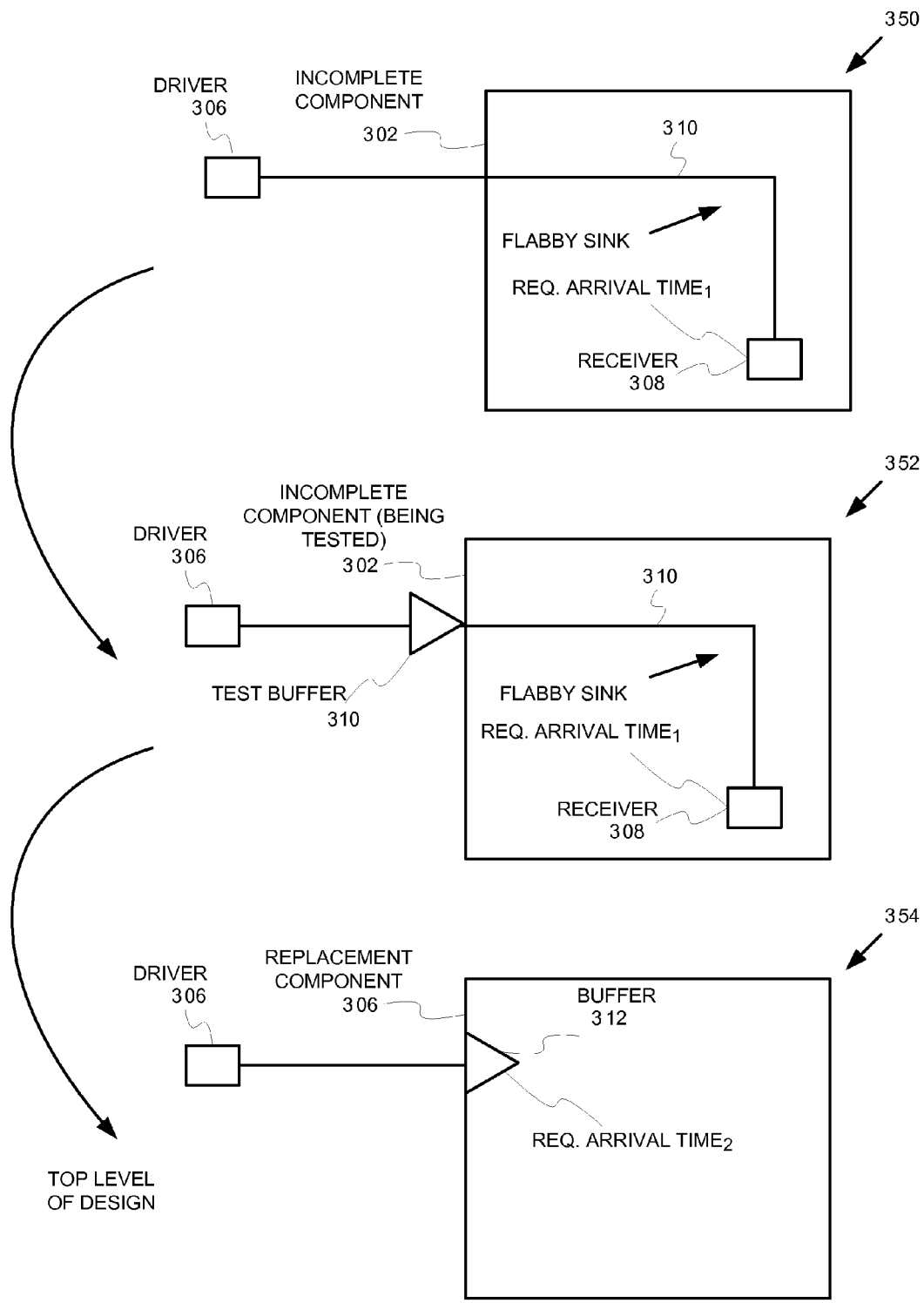
FIG. 3 depicts replacement of an incomplete component having a flabby sink, according to some example embodiments.

FIG. 3 depicts replacement of an incomplete component having a flabby sink, according to some example embodiments. FIG. 3 depicts three stages for a component having a flabby sink in the design. A first stage 350 is prior to the component being tested. A second stage 352 is during at time when the component is being tested to determine if the component has a weak source. A third stage 354 is after testing and includes a replacement of the incomplete component.

At the first stage 350, an incomplete component 302 includes a receiver 308 that is coupled to a driver 306 (external to the incomplete component) through a wire 310. The driver 306 drives a signal to the receiver 308 through the wire 310. Also, the time at which the signal is required to arrive at the receiver 308 is defined as Required Arrival Time$_1$ (RAT$_1$).

The circuit design module 102 of FIG. 1 tests the components in the hierarchical design that includes a sink therein. For this example, the circuit design module 102 would position a test buffer 310 at a boundary of the incomplete component 302 between the driver 306 and the receiver 308 (as shown at the second stage 352). An ideal input slew is asserted at the test buffer 310. The circuit design module 102 then measures at the receiver 308. If the input slew is greater than a sink slew limit threshold, then the component is considered to be incomplete because of a flabby sink. The sink slew limit threshold can be a value that varies depending on the particular design, the type of technology, the specifications for the design, etc.

In response (shown at third stage 354), the circuit design module 102 would replace the incomplete component in the hierarchical design with a replacement component (shown as a replacement component 306). In this replacement component, the internal network of the incomplete component is removed and replaced by a buffer 312 at the boundary of the replacement component 306 for receiving the signal from the driver 306. Also, the buffer 312 is moved to the top level of the hierarchical design. The time of the signal arriving at the buffer is defined as Required Arrival Time$_2$ (RAT$_2$), which is defined as follows:

$$RAT_2 = RAT_1 - L * \text{time of flight (internal layer)}$$

Wherein L is defined as the length of the wire connecting where the test buffer 310 at the boundary is located to the receiver 308. The unit for the time of flight can be based on picoseconds/millimeter. Accordingly, the unit for RAT$_2$ can be picoseconds. The RAT$_2$ calculation assumes an ideal buffering and layer assignment in the macro for the component.

Figure 4:
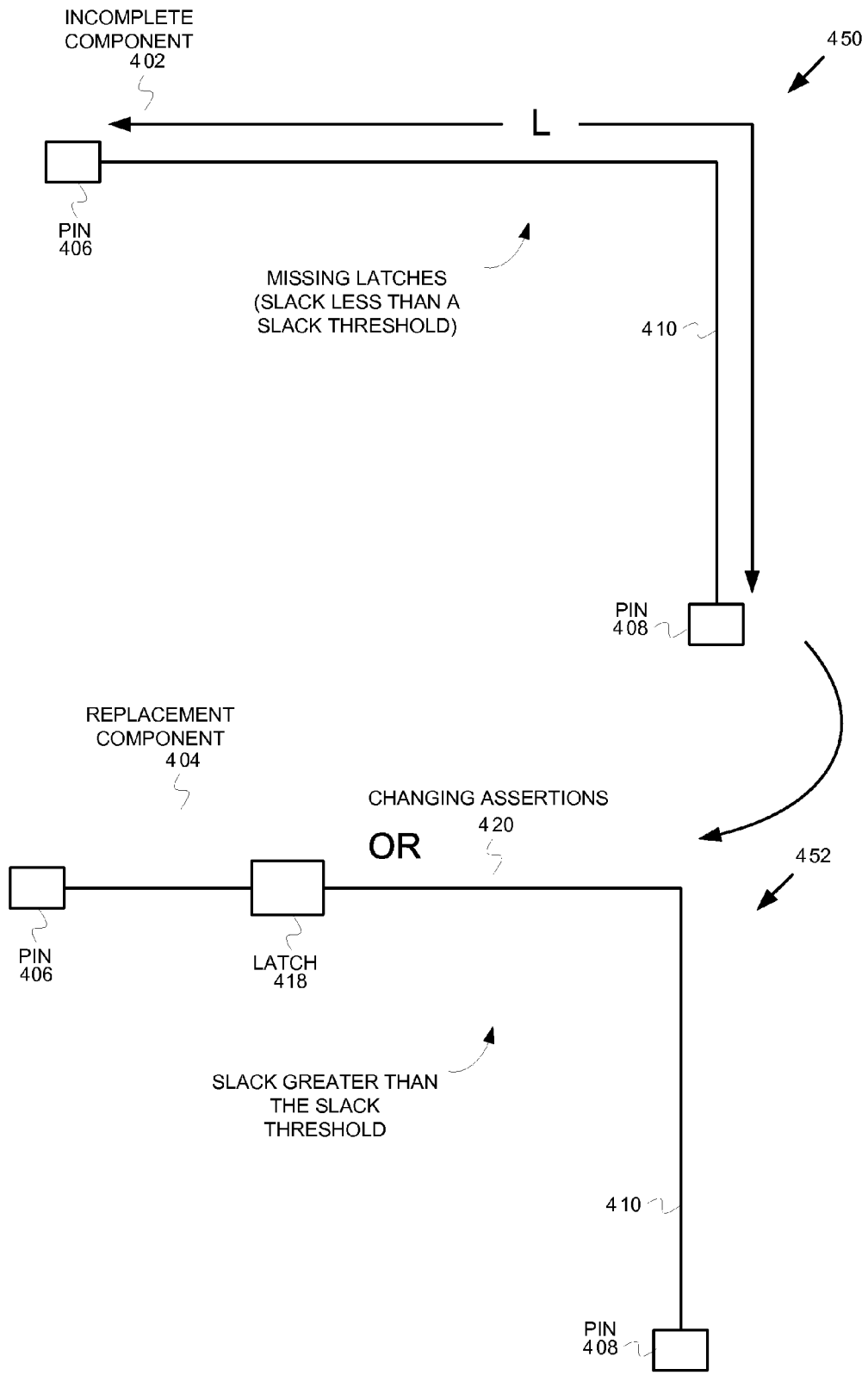
FIG. 4 depicts replacement of an incomplete component having one or more missing latches, according to some example embodiments.

FIG. 4 depicts replacement of an incomplete component having one or more missing latches, according to some example embodiments. FIG. 4 can represent a component that is the connectivity (e.g., wiring) for two other components in the design. In this example, a pin 406 for a first component is connected to a pin 408 for a second component through a wire 410. FIG. 4 depicts two stages for a component having one or more missing latches in the design. A first stage 450 is prior to and during testing of the component to determine if the component has one or more missing latches. A second stage 452 is after testing and includes a replacement of the incomplete component.

At the first stage 450, the component being tested is the wire 410 that connects the pin 406 for a first component to the pin 408 for the second component. The length of the wire 410 is L. The circuit design module 102 of FIG. 1 would test the components that are connecting other components in the hierarchical design. For the two pin nets as shown, the circuit design module 102 would assume the following for transmission of the signal from the pin 406 to the pin 408 along the wire 410:

$$\text{Best Delay} = L * \text{time of flight(layer)}$$

Accordingly, blockages are ignored and the most powerful buffers are used. Buffer resources and area congestion are not considered. Also, the circuit design module 102 assumes the best layer (typically the top layer). The circuit design module 102 then determines the slack value for the signal arriving at the pin 408 along the wire 410. If the slack value is less than a defined slack threshold for this component, the component (the wire 410) is defined as incomplete. For example, assume that the hierarchical design is a design for a five Giga Hertz (GHz) microprocessor, wherein the cycle time is 200 picoseconds. Also for this example, assume that the arrival time for the signal at the pin 408 from the pin 406 along the wire 410 is 150 picoseconds; L is 3 millimeters (mm); and time of flight on best layer is 20 ps/mm. In this example, the slack would be −10 picoseconds (150−3*20 picoseconds. Therefore, this component is considered hopeless. In some example embodiments, the circuit design module 102 can iterate to discover the dependency components. In particular, the circuit design module 102 can mark components that are considered hopeless in a first round with a default layer. The circuit design module 102 can then rerun again to find components that depend on these hopeless components.

In response to the component being incomplete (hopeless) (shown at the second stage 452), the circuit design module 102 would replace the incomplete component in the hierarchical design with a replacement component (shown as a replacement component 404). In particular, an ideal way is to add one or more latches (see latch 418) so that the slack is positive (adding one latch in the middle of the wire would make slack 200−150−1.5*20=20 ps). However, the logic designers may not be ready to add the latches. Therefore, the assertions can be changed (see changing assertions 420). For example, the arrival time can be changed to be 150−30=120 ps and the best slack would be 200−120−3*20=20 ps. Note that with this adjustment, the circuit design module 102 still needs to insert real buffers to make the "best slack" achievable. In some example embodiments, the circuit design module 102 is not allowed to change the layer assignment for the component to attempt to correct this hopeless component. For example, the circuit design module 102 is precluded from moving the component to higher layers in order to increase the speed of the signal. In particular, the best delay scenario has been assumed and did not correct the hopeless component. Therefore, allowing the circuit design module 102 to move the component to higher layers in the hierarchical design would not correct the hopeless component and would unnecessarily congest the higher layers (that could be used by other components instead). In some example embodiments, the designer can predefine the traits of a layer based on the predicted number of latches.

In some example embodiments, the circuit design module 102 can determine if the wiring within a component has slack that is less than a slack threshold. The circuit design module 102 applies a zero wire delay module for the components at the top layer and applies a real wire delay model for the nets within the components. If the net has a slack that is less than a slack threshold, the net is considered hopeless. Accordingly, the circuit design module 102 can add buffers to reduce the slack within the net. Also in some example embodiments, the circuit design module 102 is not allowed to change the layer assignment for this net (as described above).

Figure 5:
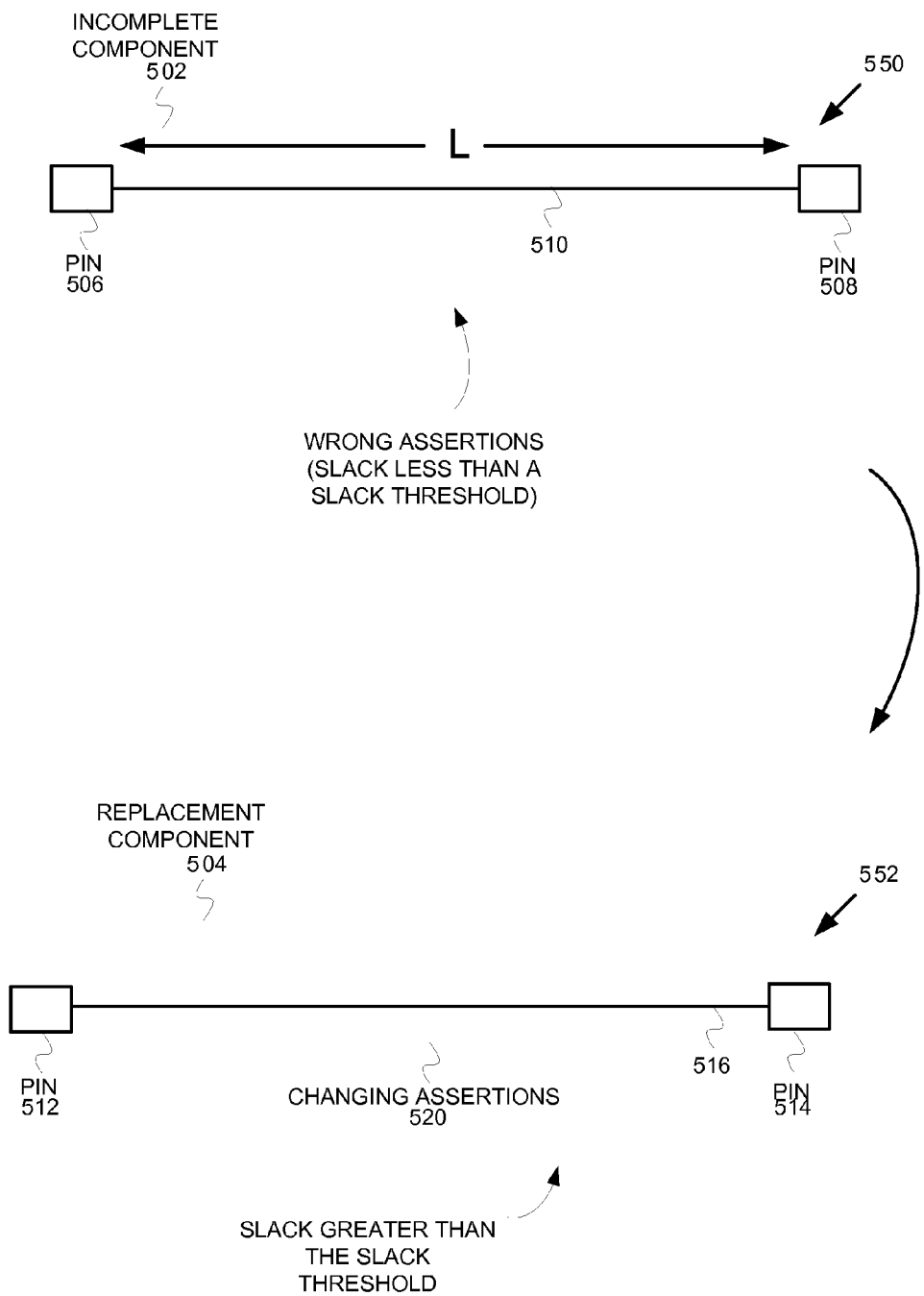
FIG. 5 depicts replacement of an incomplete component having wrong assertions, according to some example embodiments.

FIG. 5 depicts replacement of an incomplete component having wrong assertions, according to some example embodiments. Similar to FIG. 4, the incomplete component of FIG. 5 can represent a component that is the connectivity (e.g., wiring) for two other components in the design. The assertions for the component can be different inputs. Returning to the example of the component that is part of an integrated circuit for a five GHz microprocessor (wherein the cycle time is 200 picoseconds). A wrong or missed assertion can define an arrival time at a pin that is not possible. For example, assume the arrival time for the signal at a pin is 250 picoseconds. This assertion is wrong because even with zero delay the slack would be −50 picoseconds.

In the example of FIG. 5, a pin 506 for a first component is connected to a pin 508 for a second component through a wire 510. FIG. 5 depicts two stages for a component having wrong assertions in the design. A first stage 550 is prior to and during testing of the component to determine if the component has missing or wrong assertions. A second stage 552 is after testing and includes a replacement of the incomplete component.

At the first stage 550, the component being tested is the wire 510 that connects the pin 506 for a first component to the pin 508 for the second component. The length of the wire 510 is L. The circuit design module 102 of FIG. 1 would test the components that are connecting other components in the hierarchical design. For the two pin nets as shown, the circuit design module 102 would assume the following for transmission of the signal from the pin 506 to the pin 508 along the wire 510:

Best Delay=$L$*time of flight(layer)

Accordingly, blockages are ignored and the most powerful buffers are used. Buffer resources and area congestion are not considered. Also, the circuit design module 102 assumes the best layer (typically the top layer). The circuit design module 102 then determines the slack value for the signal arriving at the pin 508 along the wire 510. If the slack value is less than a defined slack threshold for this component, the component (the wire 410) is defined as incomplete. Therefore, this component is considered hopeless. In some example embodiments, the circuit design module 102 can iterate to discover the dependency components. In particular, the circuit design module 102 can mark components that are considered hopeless in a first round with a default layer. The circuit design module 102 can then rerun again to find components that depend on these hopeless components.

In response to the component being incomplete (hopeless) (shown at the second stage 552), the circuit design module 102 would replace the incomplete component in the hierarchical design with a replacement component (shown as a replacement component 504). In particular, the assertions can be changed (see changing assertions 520). For example, the arrival time can be changed to be 150−30=120 ps and the best slack would be 200−120−3*20=20 ps. In some example embodiments, the circuit design module 102 is not allowed to change the layer assignment for the component to attempt to correct this hopeless component. For example, the circuit design module 102 is precluded from moving the component to higher layers in order to increase the speed of the signal. In particular, the best delay scenario has been assumed and did not correct the hopeless component. Therefore, allowing the circuit design module 102 to move the component to higher layers in the hierarchical design would not correct the hopeless component and would unnecessarily congest the higher layers (that could be used by other components instead).

In some example embodiments, the circuit design module 102 can determine if the wiring within a component has slack that is less than a slack threshold. The circuit design module 102 applies a zero wire delay module for the components at the top layer and applies a real wire delay model for the nets within the components. If the net has a slack that is less than a slack threshold, the net is considered hopeless. Accordingly, the circuit design module 102 can add buffers to reduce the slack within the net. Also in some example embodiments, the circuit design module 102 is not allowed to change the layer assignment for this net (as described above).

Figure 6:
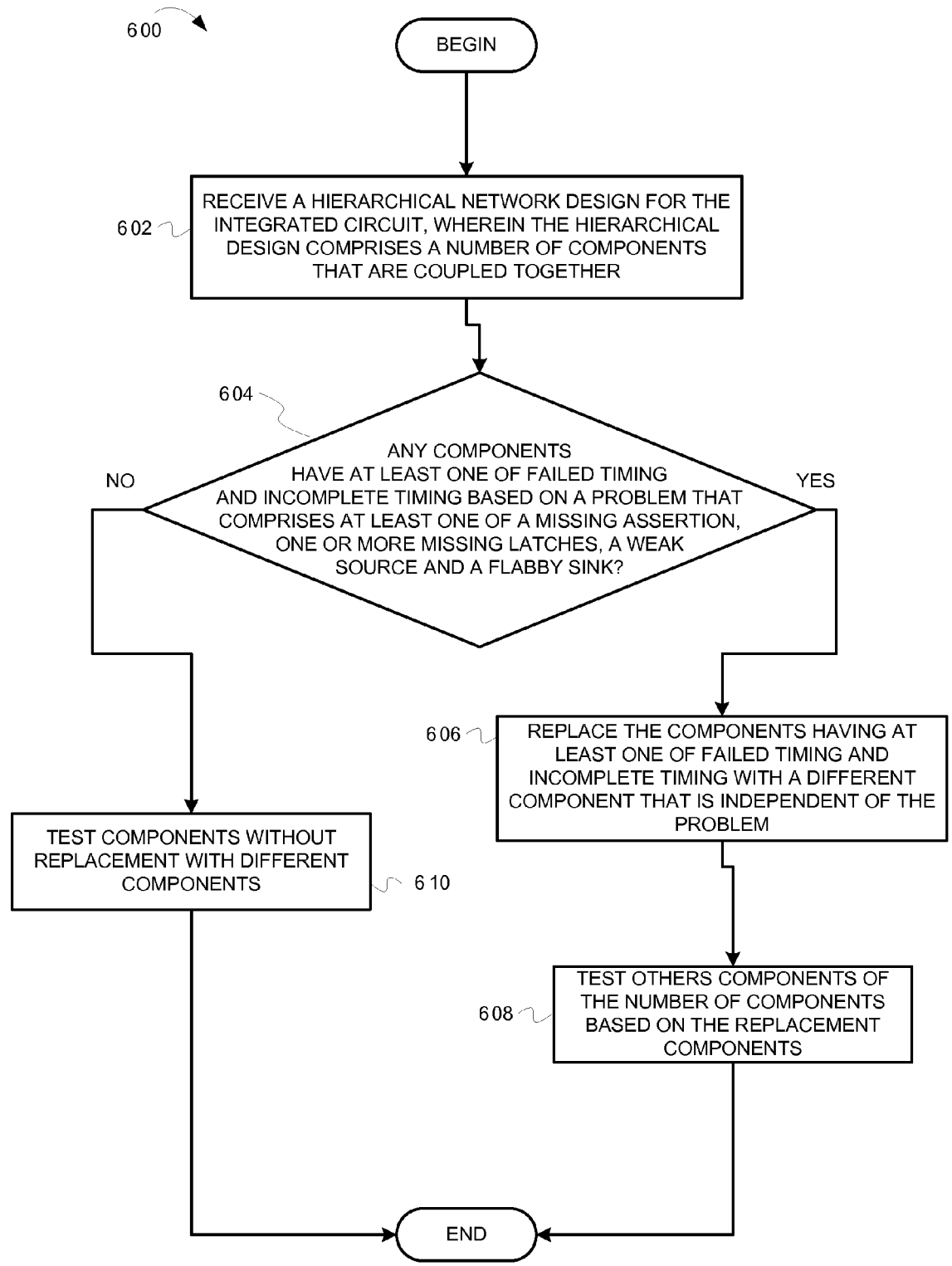
FIG. 6 depicts a flowchart for early design cycle optimization for designs having components with incomplete or failed timing, according to some example embodiments.

FIG. 6 depicts a flowchart for early design cycle optimization for designs having components with incomplete or failed timing, according to some example embodiments. FIG. 6 depicts a flowchart 600. Operations of the flowchart 600 are described in reference to FIGS. 1-5 and are performed by the circuit design module 102 of FIG. 1. The operations of the flowchart 600 begin at block 602.

At block 602, the circuit design module 102 receives a hierarchical network design for the integrated circuit, wherein the hierarchical design comprises a number of components that are coupled together. With reference to FIG. 1, the circuit design module 102 receives the hierarchical design 106 that can be represented as code or language that can be processed by the circuit design module 102. Operations of the flowchart 600 continue at block 604.

At block 604, the circuit design module 102 determines whether any components have at least one of failed timing and incomplete timing based on a problem that comprises at least one of a missing assertion, one or more missing latches, a weak source and a flabby sink. As described above in reference to FIGS. 2-5, the circuit design module 102 determines whether any of the components having failed or incomplete timing based on the different problems. If any of the components have failed or incomplete timing based on one of the problems, operations of the flowchart 600 continue at block 606. Otherwise, operations continue at block 610.

At block 606, the circuit design module 102 replaces the components having at least one of failed timing and incomplete timing with a different component that is independent of the problem. As described above in reference to FIGS. 2-5, the circuit design module 102 replaces the incomplete component with a replacement component depending on the type of problem. Additionally, the circuit design module 102 can provide the constraints defined by the replacement component back to the designer of the incomplete component that was replaced. Operations of the flowchart 600 continue at block 608.

At block 608, the circuit design module 102 tests others components of the number of components based on the replacement components. Accordingly, the other components in the hierarchical design can be tested without using incomplete components that could adversely affect the timing of the signal among the components. Operations of the flowchart 600 are complete along this path.

At block 610, the circuit design module 102 test components without replacement with different components. In particular, components are the hierarchical design are not considered incomplete. Accordingly, the components in the design can be tested with the current group of components. Operations of the flowchart 600 are complete.

As will be appreciated by one skilled in the art, aspects of the present inventive subject matter may be embodied as a system, method or computer program product. Accordingly, aspects of the present inventive subject matter may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present inventive subject matter may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present inventive subject matter may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present inventive subject matter are described with reference to flowchart illustrations and/or block diagrams of methods, apparatus (systems) and computer program products according to embodiments of the inventive subject matter. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 7:
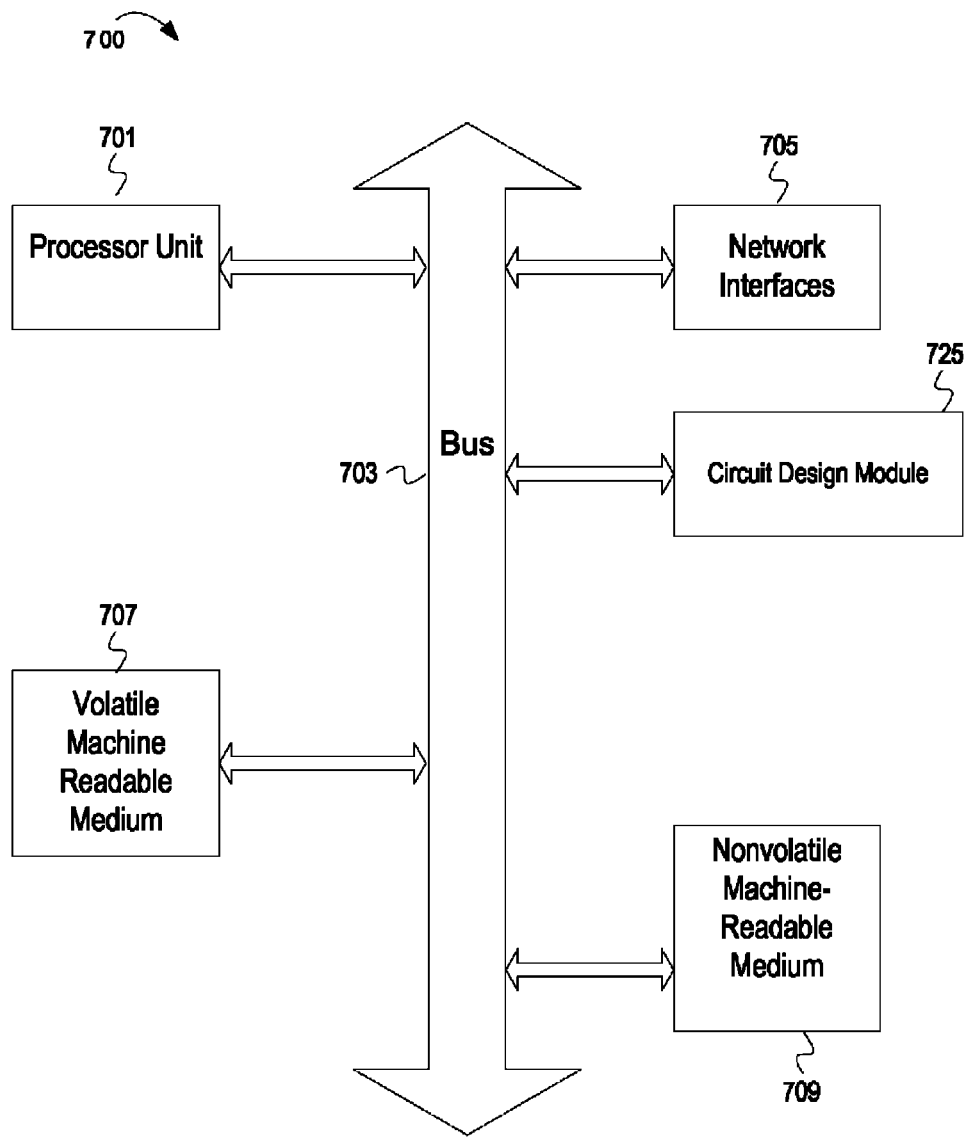
FIG. 7 depicts a computer system, according to some example embodiments.

FIG. 7 depicts a computer system, according to some example embodiments. In particular, a computer system 700 can be representative of a node that is coupled to one or more link-local zones (as described herein). The computer system 700 includes a processor unit 701 (possibly including multiple processors, multiple cores, multiple nodes, and/or implementing multi-threading, etc.). The computer system 700 includes a volatile machine readable medium 707. The volatile machine readable medium 707 can be system memory (e.g., one or more of cache, SRAM, DRAM, zero capacitor RAM, Twin Transistor RAM, eDRAM, EDO RAM, DDR RAM, EEPROM, NRAM, RRAM, SONOS, PRAM, etc.) or any one or more of the above already described possible realizations of machine-readable media. The computer system 700 also includes a bus 703 (e.g., PCI, ISA, PCI-Express, HyperTransport®, InfiniBand®, NuBus, etc.), a network interface 705 (e.g., an ATM interface, an Ethernet interface, a Frame Relay interface, SONET interface, wireless interface, etc.), and a nonvolatile machine-readable medium 709 (e.g., optical storage, magnetic storage, etc.). The network interfaces 705 can include the one or more interfaces that are to be configured (as described herein). The computer system 700 includes a circuit design module 725 that can be representative of the circuit design module 102 of FIG. 1 and can perform the operations (as described herein). Any one of these functionalities may be partially (or entirely) implemented in hardware and/or on the processing unit 701. For example, the functionality may be implemented with an application specific integrated circuit, in logic implemented in the processing unit 701, in a co-processor on a peripheral device or card, etc. Further, realizations may include fewer or additional components not illustrated in FIG. 7 (e.g., video cards, audio cards, additional network interfaces, peripheral devices, etc.). The processor unit 701, the nonvolatile machine readable medium 709, the volatile machine-readable medium 707, the network interface 705, and the interface configuration module 725 are coupled to the bus 703. Although illustrated as being coupled to the bus 703, the volatile machine-readable medium 707 can be coupled to the processor unit 701.

While the embodiments are described with reference to various implementations and exploitations, it will be understood that these embodiments are illustrative and that the scope of the inventive subject matter is not limited to them. In general, techniques for page turning as described herein may be implemented with facilities consistent with any hardware system or hardware systems. Many variations, modifications, additions, and improvements are possible.

Plural instances may be provided for components, operations or structures described herein as a single instance. Finally, boundaries between various components, operations and data stores are somewhat arbitrary, and particular operations are illustrated in the context of specific illustrative configurations. Other allocations of functionality are envisioned and may fall within the scope of the inventive subject matter. In general, structures and functionality presented as separate components in the exemplary configurations may be implemented as a combined structure or component. Similarly, structures and functionality presented as a single component may be implemented as separate components. These and other variations, modifications, additions, and improvements may fall within the scope of the inventive subject matter.

What is claimed is:

1. A computer-implemented method for designing an integrated circuit, the computer-implemented method comprising:

receiving, by a processor, a hierarchical network design for the integrated circuit, wherein the hierarchical design comprises a number of components that are coupled together;

detecting that a component of the number of components has at least one of failed timing or incomplete timing based on a problem that comprises a sink having an input sink slew that is greater than a sink slew limit threshold, wherein the component comprises the sink, wherein the detecting comprises:

adding a first test buffer at a boundary of the sink; and determining that the input sink slew at a receiver in the component is greater than the sink slew limit threshold;

replacing the component with a different component that is independent of the problem, wherein replacing the component with the different component comprises:

asserting a new buffer at an input of the sink;

asserting a slew that is less than the sink slew limit threshold for the sink; and asserting a new arrival time for data at the new buffer that is approximately equal to an arrival time at the receiver in the component minus a length of a wire connecting the first test buffer and the receiver multiplied by a time of flight along the wire for the data between the driver and the first test buffer; and testing others components of the number of components based on the different component.

2. The computer-implemented method of claim 1, wherein the problem comprises a source driver having an input source slew that is greater than a source slew limit threshold, wherein the component comprises the source driver, wherein detecting comprises:

adding a second test buffer at a boundary of the source driver; and determining that the input source slew at the second test buffer is greater than the source slew limit threshold.

3. The computer-implemented method of claim 1, wherein the problem comprises at least one of a missing assertion or one or more missing latches, wherein the component comprises wiring that connects two other components of the number of components, wherein detecting comprises:

configuring the connecting of the two other components using the component based on a best delay between the two other components, wherein the best delay is defined as a length of the wiring multiplied by a time of flight for a signal traveling along the wiring; and determining whether a slack at a receiver component of the two other components receiving the signal is less than a slack threshold based on the best delay;

wherein replacing the component with the different component comprises inserting one or more latches along the wiring between the two other components such that the slack at the receiver component is greater than the slack threshold, wherein replacing the component with the different component is independent of a layer promotion for the different component relative to a layer for the component in the hierarchical design.

4. An apparatus comprising:

a processor; and a circuit design module executable on the processor, the circuit design module configured to, receive a hierarchical network design for an integrated circuit, wherein the hierarchical design comprises a number of components that are coupled together;

detect that a component of the number of components has at least one of failed timing or incomplete timing based on a problem that comprises a sink having an input sink slew that is greater than a sink slew limit threshold, wherein the component comprises the sink, wherein the circuit design module configured to detect comprises the circuit design module configured to:
    add a first test buffer at a boundary of the sink; and
    determine that the input sink slew at a receiver in the component is greater than the sink slew limit threshold;
replace the component with a different component that is independent of the problem, wherein the circuit design module configured to replace the component with the different component comprises the circuit design module configured to:
    assert a new buffer at an input of the sink;
    assert a slew that is less than the sink slew limit threshold for the sink; and
    assert a new arrival time for data at the new buffer that is approximately equal to an arrival time at the receiver in the component minus a length of a wire connecting the first test buffer and the receiver multiplied by a time of flight along the wire for the data between the driver and the first test buffer; and
test others components of the number of components based on the different component.

5. The apparatus of claim 4, wherein the problem comprises a source driver having an input source slew that is greater than a source slew limit threshold, wherein the component comprises the source driver, wherein the circuit design module configured to detect comprises the circuit design module configured to:
    add a second test buffer at a boundary of the source driver; and
    determine that the input source slew at the second test buffer is greater than the source slew limit threshold.

6. The apparatus of claim 4, wherein the problem comprises at least one of a missing assertion or one or more missing latches, wherein the component comprises wiring that connects two other components of the number of components, wherein the circuit design module configured to detect comprises the circuit design module configured to:
    configure the connecting of the two other components using the component based on a best delay between the two other components, wherein the best delay is defined as a length of the wiring multiplied by a time of flight for a signal traveling along the wiring; and
    determine whether a slack at a receiver component of the two other components receiving the signal is less than a slack threshold based on the best delay;
    wherein replacement of the component with the different component comprises operations configured to insert one or more latches along the wiring between the two other components such that the slack at the receiver component is greater than the slack threshold, wherein replacement of the component with the different component is independent of a layer promotion for the different component relative to a layer for the component in the hierarchical design.

7. A computer program product for designing an integrated circuit, the computer program product comprising:
    a computer readable storage medium having computer usable program code embodied therewith, the computer usable program code comprising a computer usable program code configured to:
        receive a hierarchical network design for the integrated circuit, wherein the hierarchical design comprises a number of components that are coupled together;
        detect that a component of the number of components has at least one of failed timing or incomplete timing based on a problem that comprises
        a sink having an input sink slew that is greater than a sink slew limit threshold, wherein the component comprises the sink, wherein the computer usable program code configured to detect comprises computer usable program code configured to:
            add a first test buffer at a boundary of the sink; and
            determine that the input sink slew at a receiver in the component is greater than the sink slew limit threshold;
        replace the component with a different component that is independent of the problem, wherein the computer usable program code configured to replace the component with the different component comprises computer usable program code configured to:
            assert a new buffer at an input of the sink;
            assert a slew that is less than the sink slew limit threshold for the sink; and
            assert a new arrival time for data at the new buffer that is approximately equal to an arrival time at the receiver in the component minus a length of a wire connecting the first test buffer and the receiver multiplied by a time of flight along the wire for the data between the driver and the first test buffer; and
        test others components of the number of components based on the different component.

8. The computer program product of claim 7, wherein the problem comprises a source driver having an input source slew that is greater than a source slew limit threshold, wherein the component comprises the source driver, wherein the computer usable program code configured to detect comprises computer usable program code configured to:
    add a second test buffer at a boundary of the source driver; and
    determine that the input source slew at the second test buffer is greater than the source slew limit threshold.

9. The computer program product of claim 7, wherein the problem comprises at least one of a missing assertion or one or more missing latches, wherein the component comprises wiring that connects two other components of the number of components, wherein the computer usable program code configured to detect comprises computer usable program code configured to:
    configure the connecting of the two other components using the component based on a best delay between the two other components, wherein the best delay is defined as a length of the wiring multiplied by a time of flight for a signal traveling along the wiring; and
    determine whether a slack at a receiver component of the two other components receiving the signal is less than a slack threshold based on the best delay;
    wherein replacement of the component with the different component comprises operations configured to insert one or more latches along the wiring between the two other components such that the slack at the receiver component is greater than the slack threshold, wherein replacement of the component with the different component is independent of a layer promotion for the different component relative to a layer for the component in the hierarchical design.

* * * * *